United States Patent
Wu

(10) Patent No.: US 9,353,919 B2
(45) Date of Patent: May 31, 2016

(54) WHITE LED LAMP SECONDARY ENCAPSULATION STRUCTURE CAPABLE OF REDUCING BLUE-LIGHT HAZARDS

(71) Applicant: Zhengming Wu, Shanghai (CN)

(72) Inventor: Zhengming Wu, Shanghai (CN)

( * ) Notice: Subject to any disclaimer, the term of this patent is extended or adjusted under 35 U.S.C. 154(b) by 0 days.

(21) Appl. No.: 14/764,187

(22) PCT Filed: Jun. 14, 2013

(86) PCT No.: PCT/CN2013/077219
§ 371 (c)(1),
(2) Date: Jul. 29, 2015

(87) PCT Pub. No.: WO2014/117466
PCT Pub. Date: Aug. 7, 2014

(65) Prior Publication Data
US 2016/0003424 A1    Jan. 7, 2016

(30) Foreign Application Priority Data

| Feb. 1, 2013 | (CN) | 2013 1 0040930 |
| Feb. 1, 2013 | (CN) | 2013 1 0040963 |
| Feb. 22, 2013 | (CN) | 2013 1 0057390 |
| May 30, 2013 | (CN) | 2013 1 0210862 |

(51) Int. Cl.
| H05B 33/14 | (2006.01) |
| H05B 33/04 | (2006.01) |
| F21K 99/00 | (2016.01) |
| H01L 33/50 | (2010.01) |
| F21V 9/16 | (2006.01) |
| F21Y 101/02 | (2006.01) |

(52) U.S. Cl.
CPC ... *F21K 9/56* (2013.01); *F21V 9/16* (2013.01); *H01L 33/504* (2013.01); *F21Y 2101/02* (2013.01); *H01L 33/507* (2013.01)

(58) Field of Classification Search
CPC .......... F21K 9/56; F21V 9/16; F21Y 2101/02
See application file for complete search history.

(56) References Cited

U.S. PATENT DOCUMENTS

| 2006/0245201 A1* | 11/2006 | Wada | F21S 48/1159 362/545 |
| 2008/0191620 A1* | 8/2008 | Moriyama | H01L 33/56 313/506 |
| 2012/0155059 A1* | 6/2012 | Hoelen | F21K 9/135 362/84 |
| 2012/0250305 A1* | 10/2012 | Shimizu | F21K 9/1355 362/231 |
| 2013/0093307 A1* | 4/2013 | Cheng | F21K 9/56 313/36 |

* cited by examiner

*Primary Examiner* — Donald Raleigh

(57) ABSTRACT

A white LED lamp secondary encapsulation structure capable of reducing blue-light hazards has a substrate (3), a blue light LED chip (4) fixed on the substrate (3), and a YAG yellow fluorescent powder layer (6) overlaid on the blue light LED chip (4). A fluorescent outer lampshade (1) covering the blue light LED chip (4) and the YAG yellow fluorescent powder layer (6) is further fixed on the substrate (3). YAG yellow fluorescent powder is provided on the fluorescent outer lampshade (1). The structure allows emission of more uniform, soft and harmonious colors of white light, and reduces the influence of heat dissipated by the blue light chip on the performance of the fluorescent powder, thus preventing color temperature drift due to the heat of the chip, prolonging the lifespan of the fluorescent powder, reducing blue-light radiation dosage, scattering blue-light radiation, and reducing potential hazards to human and organisms.

8 Claims, 1 Drawing Sheet

WHITE LED LAMP SECONDARY ENCAPSULATION STRUCTURE CAPABLE OF REDUCING BLUE-LIGHT HAZARDS

BACKGROUND OF THE INVENTION

The present invention relates to LED lighting technologies and particularly pertains to a white LED lamp secondary encapsulation structure which is capable of reducing blue-light hazards.

White Light-Emitting Diodes (WLEDs) are described as the "fourth generation" light sources. They are new solid-state lighting components developed in recent decades. In comparison to existing light sources (incandescent lamp, fluorescent lamp etc.), they have many significant advantages, such as energy-saving, small size, long lifespan, vibration-proof, quick responsiveness and absence of harmful substances such as mercury. The application scopes in which they are currently implemented include indoor lighting, lighting inside transportation means such as trains, ships, planes and so on, flashlight, LCD backlight (vehicles, stereos instrument panels, back light panels of mobile phones etc.), traffic lights, marker lights, messages displays, etc. The ultimate goal of their application is to replace traditional light sources.

A more popular and mature application currently in use is a white LED encapsulation technology: by covering YAG yellow fluorescent powder over a fixed blue-light chip, encapsulation is done with no space between the fluorescent powder and the chip. After encapsulation, an outer cover is provided to form an LED light. The blue light excites the fluorescent powder in short range to emit yellow light; the blue and yellow lights are transformed into polychromatic white light. With continued development and pursuit of better brightness, the luminous efficiency of such LED lights is getting higher and higher.

However, the LED lights of traditional structure have some inherent problems:

1. The point source of light results in poor photochromic uniformity and makes people feel blinded. At present, the common practice is the use of a sandblasted light-permeable cover for emitting softer light, but this practice sacrifices some luminous intensity, thus resulting in lower luminous efficiency, limited emission angle, and poor uniformity and consistency as proportion of blue light in the white light would not be lowered.

2. Since the temperature generated by the operating current continues to rise, the luminous efficiency of fluorescent powder would also decline sharply; meanwhile, the emission peak is wide and short, the blue light excitation peak is high and narrow, the wavelength is short and the energy is high, so that it can directly penetrate the lens and reach the retina at the back of the eyes, thus activating cellular oxidizing reaction and initiating apoptosis, leading to retinal cell damage, decreased vision or even vision loss. People have already been alarmed by the possible damages to human eyes caused by LED blue light leakage.

BRIEF SUMMARY OF THE INVENTION

In view of the above, the present invention provides a white LED lamp secondary encapsulation structure which could effectively reduce blue light radiation dose and achieve white light uniformity and consistency, so as to overcome the deficiencies of the prior art.

To achieve this, the present invention adopts the following technical proposal:

A white LED lamp secondary encapsulation structure capable of reducing blue-light hazards comprises a substrate, a blue light LED chip fixed on the substrate, and a YAG yellow fluorescent powder layer overlaid on the blue light LED chip, characterized in that a fluorescent outer lampshade which covers the blue light LED chip and the YAG yellow fluorescent powder layer is further fixed on the substrate, and YAG yellow fluorescent powder is provided on the fluorescent outer lampshade.

In the present invention, the fluorescent outer lampshade is a covering with an inner layer coated with a luminous coating layer comprising YAG yellow fluorescent powder, or a prefabricated fluorescent cover being injection molded with light-permeable materials mixed with YAG yellow fluorescent powder.

The luminous coating layer is formed by a luminous coating material comprising YAG yellow fluorescent powder with a mass percentage of 0.5-10%; the YAG yellow fluorescent powder layer comprises YAG yellow fluorescent powder with a mass percentage of 20-25%.

The luminous coating material in weight percentage comprises 2-8% of polyoxyethylene or poly(methyl methacrylate) (PMMA) as base, 0.5-10% of YAG yellow fluorescent powder as yellow pigment, and remaining as an auxiliary filler.

The auxiliary filler in mass percentage comprises 0.5-30% of two types of materials among $Al_2O_3$, $SiO_2$, glass powder, light diffusion powder and optical whitener, 0.6-6% of a transparent dispersant which decomposes easily, and 82-96% of deionized water.

Furthermore, the luminous coating material is prepared by: fully dispersing, mixing and stirring the polyoxyethylene or poly(methyl methacrylate), the YAG yellow fluorescent powder, the two types of materials among $Al_2O_3$, $SiO_2$, glass powder, light diffusion powder and optical whitener, the transparent dispersant and the deionized water in an aqueous solution, then roll and mill slowly to produce an even mixture of the luminous coating material by a ball milling pot.

The fluorescent outer lampshade is made of glass or plastics, and has a planar, curved or O-shaped shape.

The blue light LED chip and the YAG yellow fluorescent powder layer are disposed with viscose filler or gel therebetween; and the blue light LED chip and the substrate are disposed with viscose filler or gel therebetween.

The blue light LED chip is coated with YAG yellow fluorescent powder thereon, so that the YAG yellow fluorescent powder and the blue light LED chip are encapsulated with no space therein.

Furthermore, the present invention provides another white LED lamp secondary encapsulation structure capable of reducing blue-light hazards which comprises a substrate and a blue light LED chip fixed on the substrate, characterized in that a fluorescent inner lampshade which covers the blue light LED chip is fixed on the substrate; a fluorescent outer lampshade which covers the fluorescent inner lampshade externally is fixed on the substrate; both the fluorescent outer lampshade and the fluorescent inner lampshade are provided with YAG yellow fluorescent powder.

The fluorescent outer lampshade and the fluorescent inner lampshade are coverings each with an inner surface coated with a luminous coating material comprising YAG yellow fluorescent powder, or prefabricated fluorescent covers each being injection molded with light-permeable materials mixed with YAG yellow fluorescent powder.

The luminous coating material spray coated on the fluorescent inner lampshade in mass percentage comprises 73-79% of polyacrylic acid resin or polyester resin or a mixture of both as base, 20-25% of YAG yellow fluorescent powder as yellow pigment, and 1-5% of other auxiliaries; the other auxiliaries are light diffusion agents.

According to the aforementioned white LED lamp secondary encapsulation structures capable of reducing blue-light hazards, the present invention further excites the fluorescence on the fluorescent outer lampshade on the basis of the initial excitation of the fluorescence on the chip or the fluorescence on the inner lampshade, so that the fluorescent outer lampshade is not merely a cover, but a real light-emitting surface, thereby achieving true surface light-emitting and the emission angle is not limited. In view of the above, the present invention not only provides more uniform, soft and harmonious colors of white light emitted by an LED illuminating lamp, but also effectively reduces the influence of heat dissipated by the blue chip on the performance of the fluorescent powder, thus preventing color temperature drift due to the heat of the chip, prolonging the lifespan of the fluorescent powder, effectively reducing blue-light radiation dosage, scattering blue-light radiation uniformly, and reducing potential hazards to human and organisms.

BRIEF DESCRIPTION OF THE DRAWINGS

The present invention is further described in detail with reference to the accompanying drawings and detailed embodiments.

DETAILED DESCRIPTION OF THE INVENTION

Figure 1:
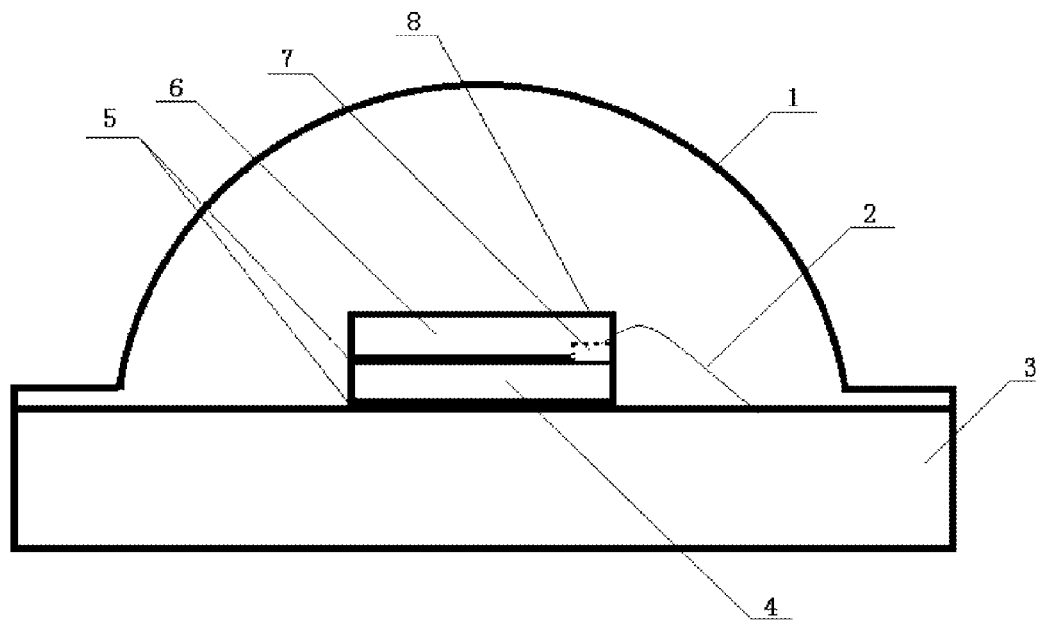
FIG. 1 illustrates the structure of the first type of LED light.

As shown in FIG. 1, the first type of white LED lamp secondary encapsulation structure which is capable of reducing blue-light hazards of the present invention comprises a fluorescent outer lampshade 1, an electrode lead 2, a substrate 3, a blue light LED chip 4, a filler 5, and a YAG yellow fluorescent powder layer 6.

The blue light LED chip 4 is fixed on the substrate 3, and the YAG yellow fluorescent powder layer 6 overlays on the blue light LED chip 4. The blue light LED chip 4 and the substrate 3 are disposed with the filler 5 or gel therebetween, and the blue light LED chip 4 and the YAG yellow fluorescent powder layer 6 are disposed with the filler 5 or gel therebetween. The fillers are either silica gel or epoxy, or a mixture of both. One end of the blue light LED chip 4 is an LED chip electrode 7. The LED chip electrode 7 is connected with the electrode lead 2.

The fluorescent outer lampshade 1 is fixed on the substrate 3 to cover the blue light LED chip 4 and the YAG yellow fluorescent powder layer 6.

The YAG yellow fluorescent powder layer 6 is a mixture of silica gel and YAG yellow fluorescent powder, in which the YAG yellow fluorescent powder has a mass percentage of 20-25%.

The fluorescent outer lampshade is a covering with an inner layer coated with a luminous coating layer comprising YAG yellow fluorescent powder. The luminous coating layer is formed by a luminous coating material which in weight percentage comprises 2-8% of polyoxyethylene or poly(methyl methacrylate) (PMMA) as base, 0.5%-10% of YAG yellow fluorescent powder as yellow pigment, and remaining as an auxiliary filler. The auxiliary filler in mass percentage comprises 0.5-30% of two types of materials among $Al_2O_3$, $SiO_2$, glass powder, light diffusion powder and optical whitener, 0.6-6% of a transparent dispersant which decomposes easily, and 82-96% of deionized water.

The luminous coating material is prepared by: fully dispersing, mixing and stirring the polyoxyethylene or poly(methyl methacrylate), the YAG yellow fluorescent powder, the two types of materials among $Al_2O_3$, $SiO_2$, glass powder, light diffusion powder and optical whitener, the transparent dispersant and the deionized water in an aqueous solution, then roll and mill slowly to produce an even mixture of the luminous coating material by a ball milling pot.

The fluorescent outer lampshade is made of glass or plastics, and has a planar, curved or O-shaped shape.

Embodiment 1

In the present embodiment, the fluorescent outer lampshade is made of glass and has a curved shape.

The luminous coating material in weight percentage comprises 5% of polyoxyethylene, 0.5% of YAG yellow fluorescent powder, 0.1% of optical whitener and light diffusion powder, 2% of transparent dispersant and 92.4% of deionized water.

The YAG yellow fluorescent powder layer 6 overlaid on the blue light LED chip 4 comprises 25% YAG yellow fluorescent powder.

Embodiment 2

In the present embodiment, the fluorescent outer lampshade is made of plastics and has a curved shape.

The luminous coating material in weight percentage comprises 5% of polyoxyethylene, 0.5% of YAG yellow fluorescent powder, 0.1% of $Al_2O_3$ and glass powder, 2% of transparent dispersant and 87.9% of deionized water.

The YAG yellow fluorescent powder layer 6 overlaid on the blue light LED chip 4 comprises 20% YAG yellow fluorescent powder.

Embodiment 3

In the present embodiment, the fluorescent outer lampshade is made of glass and has a curved shape.

The luminous coating material in weight percentage comprises 3.5% of poly(methyl methacrylate), 10% of YAG yellow fluorescent powder, 1.5% of $SiO_2$ and optical whitener, 3% of transparent dispersant and 82% of deionized water.

The YAG yellow fluorescent powder layer 6 overlaid on the blue light LED chip 4 comprises 10% YAG yellow fluorescent powder.

The luminous coating materials and the YAG yellow fluorescent powder layers in the above embodiments are made into 5 W bulb for testing respectively. In comparison with no lampshade and ordinary milky plastic lampshade, the test data are as follows:

TABLE 1

| Lampshade | Color Temperature (k) | Luminous Efficacy (ml/w) | Color Rendering | Red Color Saturation (R9) | Color Rendering Proportion (B) | Visual Observation |
|---|---|---|---|---|---|---|
| No lampshade | 3073 | 86.16 | 81.3 | 28 | 1.8% | Clustered light, strong glare |
| Ordinary milky plastic lampshade | 3051 | 79.66 | 80.8 | 25 | 1.8% | Uneven light emission, glare phenomenon exists |
| Embodiment 1 | 3084 | 80.06 | 79.6 | 19 | 1.6% | Uniform and soft light emission, glare phenomenon is significantly weakened |
| Embodiment 2 | 2860 | 83.2 | 75.1 | 3 | 1.3% | Uniform and soft light emission, no glare phenomenon |
| Embodiment 3 | 2680 | 87.1 | 69.5 | −21 | 0.9 | Uniform and soft light emission, reddish and yellowish light color, no glare phenomenon |

As seen from the above table, for LED lights with fluorescent outer lampshade coated with luminous coating material, the color temperature is significantly reduced, the luminous efficacy is enhanced, the blue color proportion is also significantly reduced, light emission is uniform and soft, and there is no glare phenomenon.

Figure 2:
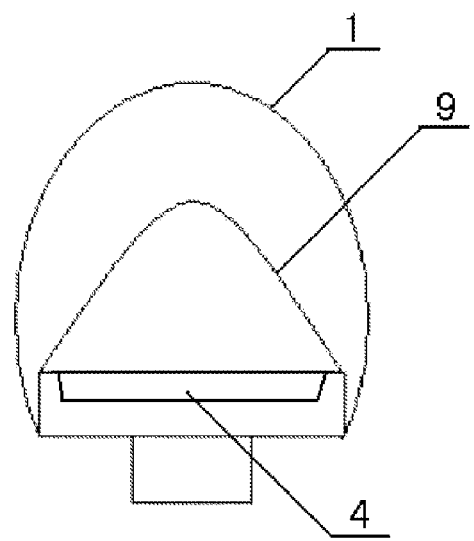
FIG. 2 illustrates the structure of the second type of LED light.

The present invention provides another white LED lamp secondary encapsulation structure capable of reducing blue-light hazards which comprises a fluorescent outer lampshade 1, a substrate 3, a blue light LED chip 4 and a fluorescent inner lampshade 9, as shown in FIG. 2

The substrate 3 has a recess 8. The blue light LED chip 4 is fixed inside the recess 8. The fluorescent inner lampshade 9 is fixed on the substrate 3 and covers the blue light LED chip 4. There is a gap between the fluorescent inner lampshade 9 and the blue light LED chip 4. Besides, the fluorescent outer lampshade 1 is larger in size than the fluorescent inner lampshade 9, and is also fixed on the substrate 3 and covers the fluorescent inner lampshade 9 externally. There is a gap between the fluorescent outer lampshade 1 and the fluorescent inner lampshade 9.

The fluorescent outer lampshade 1 and the fluorescent inner lampshade 9 are coverings each with an inner surface coated with a luminous coating material comprising YAG yellow fluorescent powder, or prefabricated fluorescent covers each being injection molded with light-permeable materials mixed with YAG yellow fluorescent powder. Yet, the fluorescent outer lampshade 1 has lower YAG yellow fluorescent powder content than the fluorescent inner lampshade 9. The fluorescent outer lampshade 1 comprises 0.5-10% YAG yellow fluorescent powder, while the fluorescent inner lampshade 9 comprises 20-25% YAG yellow fluorescent powder.

The structure of the fluorescent outer lampshade 1 and the luminous coating material of the fluorescent outer lampshade 1 are the same as the structure of the fluorescent outer lampshade and the luminous coating material of the aforementioned first type of white LED lamp secondary encapsulation structure capable of reducing blue-light hazards.

In the present type of white LED lamp secondary encapsulation structure capable of reducing blue-light hazards, the luminous coating material of the luminous coating layer of the fluorescent inner lampshade 9 in mass percentage comprises 73-79% of polyacrylic acid resin or polyester resin or a mixture of both as base, 20-25% of YAG yellow fluorescent powder as yellow pigment, and 1-5% of other auxiliaries; the other auxiliaries are light diffusion agents.

The luminous coating material is spray coated on the inner surface of the fluorescent inner lampshade 9 by electrostatic spray coating method.

The luminous coating material is prepared by: fully dispersing, mixing and stirring the polyacrylic acid resin or polyester resin or the mixture of both, the YAG yellow fluorescent powder and the light diffusion powder in an aqueous solution, then roll and mill slowly to produce an even mixture of the luminous coating material by a ball milling pot.

The prepared luminous coating material is coated on the inner surface of the fluorescent inner lampshade by electrostatic spray coating method.

Embodiment 4

In the present embodiment, the fluorescent inner lampshade is made of glass and has a curved shape.

The luminous coating material of the fluorescent inner lampshade in mass percentage comprises 78% of polyacrylic acid resin, 20% of YAG yellow fluorescent powder, and 2% of auxiliaries (light diffusion agents).

The material and shape of the fluorescent outer lampshade and the luminous coating material thereof are the same as those in Embodiment 3.

Embodiment 5

In the present embodiment, the fluorescent inner lampshade is made of plastics and has a curved shape.

The luminous coating material of the fluorescent inner lampshade in mass percentage comprises 76% of polyester resin, 22% of YAG yellow fluorescent powder, and 2% of auxiliaries (light diffusion agents).

The material and shape of the fluorescent outer lampshade and the luminous coating material thereof are the same as those in Embodiment 3.

Embodiment 6

In the present embodiment, the fluorescent inner lampshade is made of glass and has a curved shape.

The luminous coating material of the fluorescent inner lampshade in mass percentage comprises 73% of a mixture of polyacrylic acid resin and polyester resin, 25% of YAG yellow fluorescent powder, and 2% of auxiliaries (light diffusion agents).

The material and shape of the fluorescent outer lampshade and the luminous coating material thereof are the same as those in Embodiment 3.

The Embodiments 4-6 are tested twice respectively. The first test is done under a circumstance with no fluorescent outer lampshade but only fluorescent inner lampshade (as shown in the test data in table 2). The second test is done in a circumstance wherein the fluorescent outer lampshade is covered outside the fluorescent inner lampshade (as shown in the test data in table 3).

TABLE 2

(Test data with only fluorescent inner lampshade, no fluorescent outer lampshade)

| Lampshade | Color Temperature (k) | Luminous Efficacy (ml/w) | Color Rendering | Red Color Saturation (R9) | Blue Color Proportion (B) | Visual Observation |
|---|---|---|---|---|---|---|
| Embodiment 4 | 3080 | 85 | 78 | 6 | 1.5 | More uniform light emission, glare phenomenon exists |
| Embodiment 5 | 2950 | 87 | 75 | −2 | 1.5 | Slight yellowish spots in the light, glare phenomenon exists |
| Embodiment 6 | 2860 | 88 | 71 | −7 | 1.3 | Slight yellowish spots in the light, glare phenomenon exists |

TABLE 3

(Test data after the fluorescent outer lampshade is covered outside the fluorescent inner lampshade)

| Lampshade | Color Temperature (k) | Luminous Efficacy (ml/w) | Color Rendering | Red Color Saturation (R9) | Blue Color Proportion (B) | Visual Observation |
|---|---|---|---|---|---|---|
| Embodiment 4 | 3020 | 79 | 77 | 1 | 1.5 | Uniform and soft light emission, no glare phenomenon |
| Embodiment 5 | 2880 | 81 | 75 | −5 | 1.4 | Uniform and soft light emission, no glare phenomenon |
| Embodiment 6 | 2830 | 83 | 72 | −10 | 1.1 | Uniform and soft light emission, no glare phenomenon |

As seen from the above tables, when the fluorescent outer lampshade coated with luminous coating material is covered outside the fluorescent inner lampshade of an LED light, the color temperature is significantly reduced, the luminous efficacy is enhanced, the blue color proportion is also significantly reduced, light emission is uniform and soft, and there is no glare phenomenon.

What is claimed is:

1. A white LED lamp secondary encapsulation structure capable of reducing blue-light hazards comprising a substrate, a blue light LED chip fixed on the substrate, and a YAG yellow fluorescent powder layer overlaid on the blue light LED chip, characterized in that a fluorescent outer lampshade which covers the blue light LED chip and the YAG yellow fluorescent powder layer is further fixed on the substrate, and YAG yellow fluorescent powder is provided on the fluorescent outer lampshade; the fluorescent outer lampshade is a covering with an inner layer coated with a luminous coating layer comprising YAG yellow fluorescent powder, or a prefabricated fluorescent cover being injection molded with light-permeable materials mixed with YAG yellow fluorescent powder; the luminous coating layer is formed by a luminous coating material having 0.5-10% of YAG yellow fluorescent powder by mass percentage; the YAG yellow fluorescent powder layer comprises 20-25% of YAG yellow fluorescent powder by mass percentage; the luminous coating material in weight percentage comprises 2-8% of polyoxyethylene or poly(methyl methacrylate) as base, 0.5-10% of YAG yellow fluorescent powder as yellow pigment, and remaining as an auxiliary filler.

2. The white LED lamp secondary encapsulation structure capable of reducing blue-light hazards as in claim 1, characterized in that the auxiliary filter in mass percentage comprises 0.5-30% of two types of materials among $Al_2O_3$, $SiO_2$, glass powder, light diffusion powder and optical whitener, 0.6-6% of a transparent dispersant which decomposes easily, and 82-96% of deionized water.

3. The white LED lamp secondary encapsulation structure capable of reducing blue-light hazards as in claim 2, characterized in that the luminous coating material is prepared by: fully dispersing, mixing and stirring the polyoxyethylene or poly(methyl methacrylate), the YAG yellow fluorescent powder, the two types of materials among $Al_2O_3$, $SiO_2$, glass powder, light diffusion powder and optical whitener, the transparent dispersant and the deionized water in an aqueous solution, then roll and mill slowly to produce an even mixture of the luminous coating material by a ball milling pot.

4. The white LED lamp secondary encapsulation structure capable of reducing blue-light hazards as in claim 1, characterized in that the fluorescent outer lampshade is made of glass or plastics, and has a planar, curved or O-shaped shape.

5. A white LED lamp secondary encapsulation structure capable of reducing blue-light hazards comprising a substrate and a blue light LED chip fixed on the substrate, characterized in that a fluorescent inner lampshade which covers the blue light LED chip is fixed on the substrate; a fluorescent outer lampshade which covers the fluorescent inner lampshade externally is fixed on the substrate; both the fluorescent outer lampshade and the fluorescent inner lampshade are provided with YAG yellow fluorescent powder; the fluorescent outer lampshade and the fluorescent inner lampshade are coverings each with an inner surface coated with a luminous coating material comprising YAG yellow fluorescent powder, or prefabricated fluorescent covers each being injection molded with light-permeable materials mixed with YAG yellow fluorescent powder; the luminous coating material coated on the fluorescent outer lampshade in weight percentage comprises 2-8% of polyoxyethylene or poly(methyl methacrylate) (PMMA) as base, 0.5-10% YAG yellow fluorescent powder as yellow pigment, and remaining as an auxiliary filler.

6. The white LED lamp secondary encapsulation structure capable of reducing blue-light hazards as in claim 5, characterized in that the auxiliary filter in mass percentage comprises 0.5-30% of two types of materials among $Al_2O_3$, $SiO_2$, glass powder, light diffusion powder and optical whitener, 0.6-6% of a transparent dispersant which decomposes easily, and 82-96% of deionized water.

7. The white LED lamp secondary encapsulation structure capable of reducing blue-light hazards as in claim 5, characterized in that the luminous coating material spray coated on the fluorescent inner lampshade in mass percentage comprises 73-79% of polyacrylic acid resin or polyester resin or a mixture of both as base, 20-25% of YAG yellow fluorescent powder as yellow pigment, and 1-5% of auxiliaries.

8. The white LED lamp secondary encapsulation structure capable of reducing blue-light hazards as in claim 7, characterized in that the auxiliaries are light diffusion agents.

* * * * *